United States Patent
Wang

(10) Patent No.: US 6,171,963 B1
(45) Date of Patent: Jan. 9, 2001

(54) METHOD FOR FORMING A PLANAR INTERMETAL DIELECTRIC USING A BARRIER LAYER

(75) Inventor: Chien-Jung Wang, Hsinchu (TW)

(73) Assignee: Worldwide Semiconductor Manufacturing Corporation, Hsinchu (TW)

(*) Notice: Under 35 U.S.C. 154(b), the term of this patent shall be extended for 0 days.

(21) Appl. No.: 09/201,513

(22) Filed: Nov. 30, 1998

(51) Int. Cl.[7] ................. H01L 21/302; H01L 21/461
(52) U.S. Cl. ................. 438/692; 438/695; 438/706; 438/720
(58) Field of Search ............... 438/618, 622, 438/624, 625, 626, 630, 631, 643, 645, 648, 692, 697, 711, 720

(56) References Cited

U.S. PATENT DOCUMENTS

| | | | |
|---|---|---|---|
| 5,284,799 | * | 2/1994 | Sato .................. 438/618 |
| 5,554,563 | * | 9/1996 | Chen et al. ........... 438/643 |
| 5,604,158 | * | 2/1997 | Cadien et al. ........ 156/636.1 |
| 5,626,715 | * | 5/1997 | Rostoker ............. 438/693 |
| 5,691,240 | * | 11/1997 | Yang ................. 438/626 |
| 5,712,193 | * | 1/1998 | Hower et al. ......... 438/643 |
| 5,776,833 | * | 7/1998 | Chen et al. .......... 438/672 |
| 5,804,513 | * | 9/1998 | Sakatani et al. ...... 438/693 |
| 5,817,572 | * | 10/1998 | Chiang et al. ........ 438/624 |
| 5,880,018 | * | 3/1999 | Boeck et al. ......... 438/619 |

* cited by examiner

Primary Examiner—Benjamin L. Utech
Assistant Examiner—Duy-Vu Deo
(74) Attorney, Agent, or Firm—Blakely, Sokoloff, Taylor & Zafman LLP

(57) ABSTRACT

A method for forming a planar structure on a semiconductor substrate is disclosed. The method comprises the steps of: forming an interlayer dielectric atop said substrate; patterning and etching said interlayer dielectric, stopping at said substrate, to form a contact opening; forming a barrier metal layer on the bottom and sidewalls of said contact opening and atop said interlayer dielectric; depositing a conducting layer into said contact opening and atop said barrier metal layer; removing a portion of said conducting layer atop said barrier metal layer, leaving a plug in said contact opening; removing a portion of said barrier layer atop said interlayer dielectric; forming a cap barrier layer on exposed portions of said plug, said barrier metal layer, and said interlayer dielectric; and removing a portion of said cap barrier layer atop said plug.

9 Claims, 3 Drawing Sheets

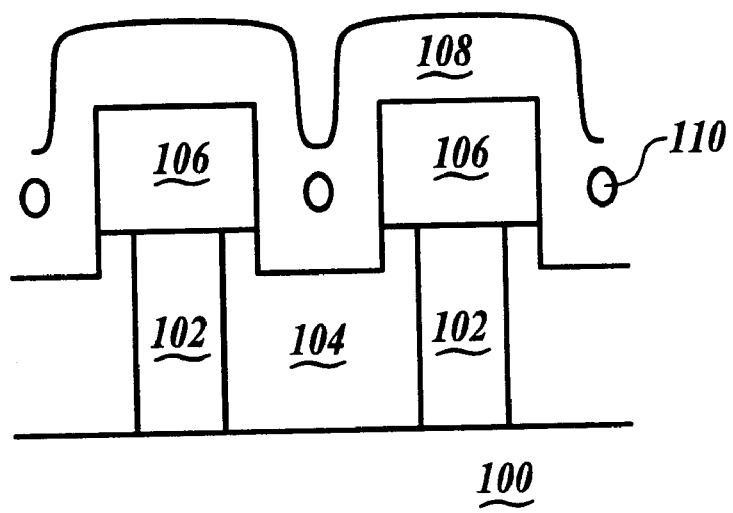
Fig. 1 *(PRIOR ART)*
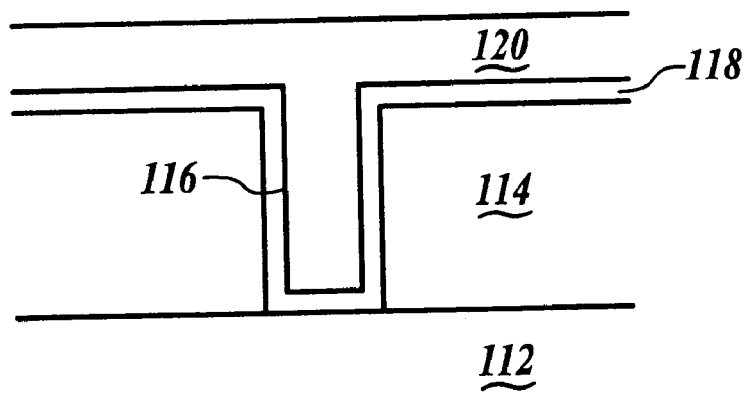
Fig. 2

METHOD FOR FORMING A PLANAR INTERMETAL DIELECTRIC USING A BARRIER LAYER

FIELD OF THE INVENTION

The present invention relates generally to semiconductor manufacturing processes, and more particularly, to a method for forming a planar intermetal dielectric using a barrier layer.

BACKGROUND OF THE INVENTION

Intermetal dielectric layers are commonly used to isolate conductive structures, such as metal layers, from subsequently deposited conducting layers. FIG. 1 shows a cross-sectional area of a semiconductor substrate 100. Atop the substrate is a plug 102 in an interlayer dielectric 104, a conductive structure 106 above the plug 102, and an intermetal dielectric layer 108. In a conventional method for forming the structure shown in FIG. 1, the metal layer forming the conductive structure 106 is overetched. Overetching of the metal layer is performed to ensure removal of metal residue. However, this overetching also causes a removal of a portion of the interlayer dielectric 104, undesirably causing an increase in step height. The increased step height worsens the planarization of the subsequent intermetal dielectric 108. In addition, the increased step height presents a keyhole problem. That is, voids 110 are created during the deposition of the intermetal dielectric layer 108.

What is needed is a method for forming a planar intermetal dielectric layer that eliminates the aforementioned problems.

SUMMARY OF THE INVENTION

A method for forming a planar structure on a semiconductor substrate is disclosed. The method comprises the steps of: forming an interlayer dielectric atop said substrate; patterning and etching said interlayer dielectric, stopping at said substrate, to form a contact opening; forming a barrier metal layer on the bottom and sidewalls of said contact opening and atop said interlayer dielectric; depositing a conducting layer into said contact opening and atop said barrier metal layer; removing a portion of said conducting layer atop said barrier metal layer, leaving a plug in said contact opening; removing a portion of said barrier metal layer atop said interlayer dielectric; forming a cap barrier layer on exposed portions of said plug, said barrier metal layer, and said interlayer dielectric; and removing a portion of said cap barrier layer atop said plug.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a cross-sectional view of a semiconductor substrate and a structure thereon formed by a conventional method; and FIGS. 2–8 show cross-sectional views of a semiconductor substrate illustrating the steps of the present invention.

DETAILED DESCRIPTION OF THE PREFERRED EMBODIMENT

Figure 3:
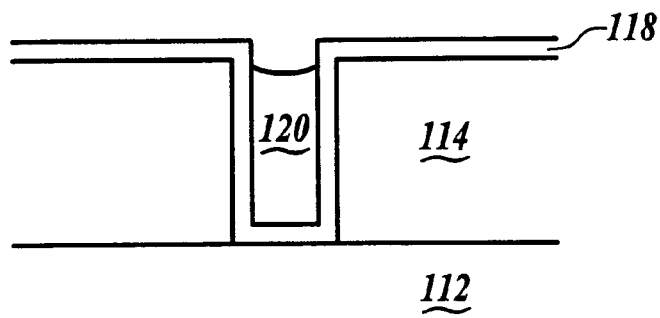

Turning to FIG. 2, a semiconductor substrate 112 is shown. The substrate is understood to possibly include a semiconductive wafer, active and passive devices formed within the wafer, and layers formed on the wafer's surface. The term "substrate" is meant to include devices formed within a semiconductor wafer and the layers overlying the wafer.

In FIG. 2, an interlayer dielectric 114 is formed atop the substrate 112. The dielectric layer may be formed of silicon oxide, borophosphosilicate glass (BPSG), tetraethylorthosilicate (TEOS) oxide or any combination thereof. A contact opening 116 is made using conventional photolithography and etching techniques. The etching is controlled to stop when the substrate 112 is reached. A barrier layer 118 is sputtered onto the bottom and sidewalls of the contact opening 116 and atop the interlayer dielectric 114. The barrier layer 118 is preferably formed of titanium or titanium nitride and is preferably 400–800 angstroms thick. Next, a tungsten layer 120 is deposited into the contact opening 116 and atop the barrier layer 118 using any conventional technique, such as chemical vapor deposition (CVD). The tungsten layer 120 is preferably 10000 angstroms in thickness. It is appreciated that other conducting materials may be used.

Turning to FIG. 3, a chemical dry etching (CDE) process is used to etch back the tungsten layer 120. The portion of the tungsten layer 120 atop the barrier layer 118 is removed, leaving a tungsten plug 120 in the contact opening 116.

Figure 4:
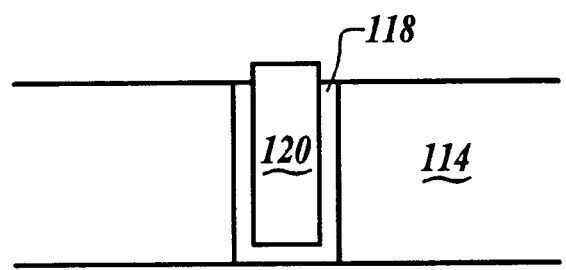

Turning to FIG. 4, a chemical mechanical polishing (CMP) is performed to remove the exposed portion of the barrier layer 118. To ensure that there is no residue from the barrier layer 118, significant overpolishing is performed. Therefore, a portion of the interlayer dielectric 114 is removed during the overpolishing, leaving a tungsten plug 120 that is raised above the interlayer dielectric 114.

Figure 5:
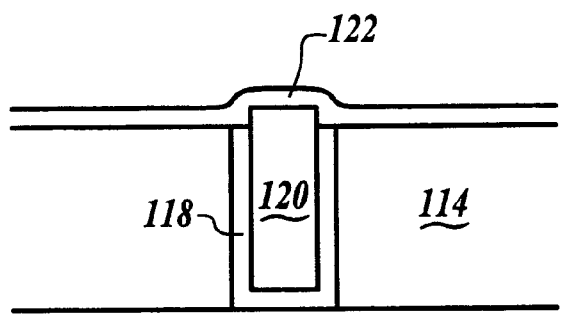

Turning to FIG. 5, a cap barrier layer 122 is deposited atop the tungsten plug 120, the top exposed portion of the barrier layer 118, and the interlayer dielectric 114. The cap barrier layer 122 is preferably formed of SiN, SiON, or BN and is preferably 1000 angstroms in thickness.

Figure 6:
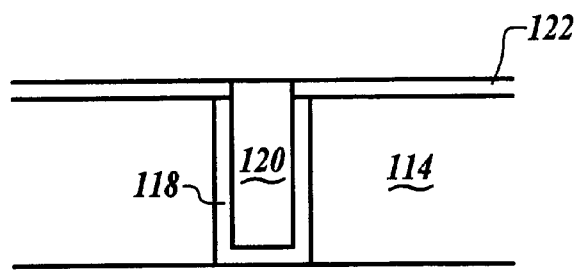

Turning to FIG. 6, the portion of the cap barrier layer 122 atop the tungsten plug 120 is removed by CMP. The resulting structure is shown in FIG. 6. The remaining cap barrier layer 122 acts as a buffer layer to planarize the top surface of the resulting structure. In addition, the cap barrier layer 122 presents many other advantages, as will be discussed further herein.

Figure 7:
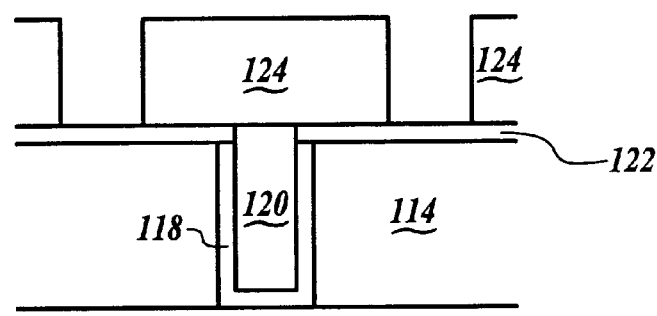

Turning to FIG. 7, a conducting layer is deposited atop the tungsten plug 120, the barrier layer 118 and the cap barrier layer 122. Using conventional photolithography and etching techniques, portions of the conducting layer are removed, leaving a conductive structure 124 above the tungsten plug 120. The etching is controlled to stop at the cap barrier layer 122. Because the cap barrier layer 122 is used as an etching stop, a high amount of overetching can be performed to remove conducting layer residue, without increasing the step height. By not increasing the step height, the keyhole problem and the planarization problem of conventional methods are avoided.

Figure 8:
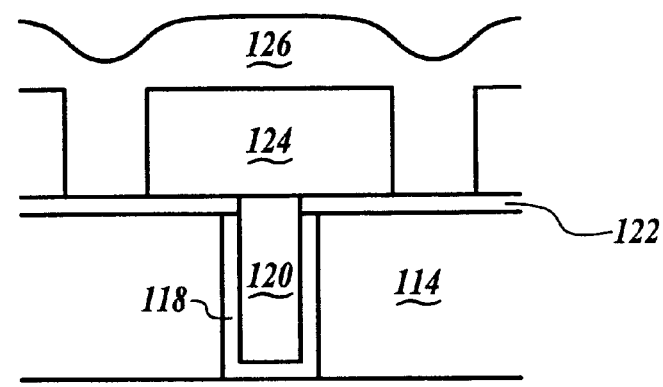

Turning to FIG. 8, an intermetal dielectric layer 126 is deposited. The intermetal dielectric layer 126 is formed of a high density plasma (HDP) oxide, standard atmosphere CVD oxide, fluorinated oxide, low k material, or other dielectric materials. If the intermetal dielectric is formed of a fluorinated oxide, the cap barrier layer 122 is useful in preventing fluorine diffusion.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a planar structure on a semiconductor substrate, the method comprising the steps of:

forming an interlayer dielectric atop said substrate;

patterning and etching said interlayer dielectric, stopping at said substrate, to form a contact opening;

forming a barrier metal layer on the bottom and sidewalls of said contact opening and atop said interlayer dielectric;

depositing a conducting layer into said contact opening and atop said barrier metal layer;

removing a portion of said conducting layer atop said barrier metal layer, leaving a plug in said contact opening, said plug having a top surface;

removing a portion of said barrier metal layer atop said interlayer dielectric, such that said plug extends above the level of said barrier metal layer and said interlayer dielectric to leave an exposed portion;

forming a cap barrier layer on said exposed portion of said plug, said barrier metal layer, and said interlayer dielectric; and removing a portion of said cap barrier layer atop said plug to expose the top surface of said plug using a chemical mechanical polishing process, so that said exposed portion and said cap barrier layer form a planarized plane.

2. The method of claim 1, wherein said interlayer dielectric is formed of silicon oxide, borophosphosilicate glass (BPSG), tetraethylorthosilicate (TEOS) oxide or any combination thereof.

3. The method of claim 1, wherein said barrier metal layer is formed of titanium or titanium nitride.

4. The method of claim 1, wherein said conducting layer is formed of tungsten, aluminum, copper or polysilicon.

5. The method of claim 1, wherein said cap barrier layer is formed of SiN, SiON, or BN.

6. The method of claim 1, wherein said barrier metal layer is 400–800 angstroms thick.

7. The method of claim 1, wherein said conducting layer is 10000 angstroms thick.

8. The method of claim 1, wherein said cap barrier layer is 1000 angstroms thick.

9. The method of claim 1, further including the steps of:

depositing a second conducting layer atop said plug, said barrier layer, and said cap barrier layer;

patterning and etching said second conducting layer, leaving a conductive structure above said plug; and depositing an intermetal dielectric layer atop said conductive structure and said cap barrier layer.

* * * * *